US009741657B2

(12) United States Patent
Filippi et al.

(10) Patent No.: US 9,741,657 B2
(45) Date of Patent: Aug. 22, 2017

(54) TSV DEEP TRENCH CAPACITOR AND ANTI-FUSE STRUCTURE

(71) Applicant: International Business Machines Corporation, Armonk, NY (US)

(72) Inventors: Ronald G. Filippi, Wappingers Falls, NY (US); Erdem Kaltalioglu, Newburgh, NY (US); Shahab Siddiqui, Somers, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 14/181,897

(22) Filed: Feb. 17, 2014

(65) Prior Publication Data

US 2015/0235944 A1 Aug. 20, 2015

(51) Int. Cl.
*H01L 23/525* (2006.01)
*H01L 23/498* (2006.01)
*H01L 29/66* (2006.01)
*H01L 29/94* (2006.01)
*H01L 21/768* (2006.01)
*H01L 23/532* (2006.01)
(Continued)

(52) U.S. Cl.
CPC .... *H01L 23/5252* (2013.01); *H01L 21/76898* (2013.01); *H01L 23/481* (2013.01);
(Continued)

(58) Field of Classification Search
CPC ............. H01L 29/66181; H01L 29/945; H01L 23/49827; H01L 23/5252; H01L 23/5384;
(Continued)

(56) References Cited

U.S. PATENT DOCUMENTS 7,839,163 B2 11/2010 Feng et al.
8,294,240 B2 10/2012 Nowak et al.
(Continued)

OTHER PUBLICATIONS

Wang et al., Conference Paper; Conference Proceeding, entitled, "Solution-derived electrodes and dielectrics for low-cost and high-capacitance trench and Through-Silicon-Via ( TSV) capacitors", presented at the 2011 IEEE 61st Electronic Components and Technology Conference, ECTC 2011 held at Lake Buena Vista, FL United States between May 31, 2011 and Jun. 3, 2011 and published in the Proceedings—Electronic Components and Technology Conference (Proc Electron Compon Technol Conf) ( United States ) 2011 (1987-1991) on Jul. 22, 2011.
(Continued)

*Primary Examiner* — Thanhha Pham
(74) *Attorney, Agent, or Firm* — Steven J. Meyers; Hoffman Warnick LLC

(57) ABSTRACT

A through-silicon-via (TSV) structure is formed within a trench located within a semiconductor structure. The TSV structure may include a first electrically conductive liner layer located on an outer surface of the trench and a first electrically conductive structure located on the first electrically conductive liner layer, whereby the first electrically conductive structure partially fills the trench. A second electrically conductive liner layer is located on the first electrically conductive structure, a dielectric layer is located on the second electrically conductive liner layer, while a third electrically conductive liner layer is located on the dielectric layer. A second electrically conductive structure is located on the third electrically conductive liner layer, whereby the second electrically conductive structure fills a remaining opening of the trench.

15 Claims, 13 Drawing Sheets

(51) Int. Cl.
*H01L 23/48* (2006.01)
*H01L 49/02* (2006.01)
*H01L 23/522* (2006.01)

(52) U.S. Cl.
CPC .. *H01L 23/53238* (2013.01); *H01L 29/66181* (2013.01); *H01L 29/945* (2013.01); *H01L 23/5223* (2013.01); *H01L 28/90* (2013.01); *H01L 2924/0002* (2013.01)

(58) Field of Classification Search
CPC ..... H01L 2225/06541; H01L 21/76898; H01L 33/832; H01L 28/90; H01L 27/10829
See application file for complete search history.

(56) References Cited

U.S. PATENT DOCUMENTS

| | | | |
|---|---|---|---|
| 8,298,906 B2 | 10/2012 | Bernstein et al. | |
| 8,304,863 B2 | 11/2012 | Filippi et al. | |
| 8,350,359 B2 | 1/2013 | Petrarca et al. | |
| 8,492,241 B2 | 7/2013 | Cheng et al. | |
| 8,525,296 B1 | 9/2013 | Lin et al. | |
| 2007/0012973 A1* | 1/2007 | Nasu | H01L 21/76831 257/295 |
| 2009/0014768 A1* | 1/2009 | Lin | H01L 27/10823 257/301 |
| 2009/0305478 A1* | 12/2009 | Yang | H01L 21/0206 438/393 |
| 2010/0164062 A1 | 7/2010 | Wang et al. | |
| 2010/0187525 A1 | 7/2010 | Bartley et al. | |
| 2010/0200949 A1 | 8/2010 | Booth, Jr. et al. | |
| 2012/0049322 A1 | 3/2012 | Su et al. | |
| 2014/0367828 A1* | 12/2014 | Colonna | H01L 28/40 257/532 |

OTHER PUBLICATIONS

Anonymous, ip.com Paper, IPCOM000207670D Jun. 9, 2011, entitled, "Capacitor Array with TSV for 3D Applications".

* cited by examiner

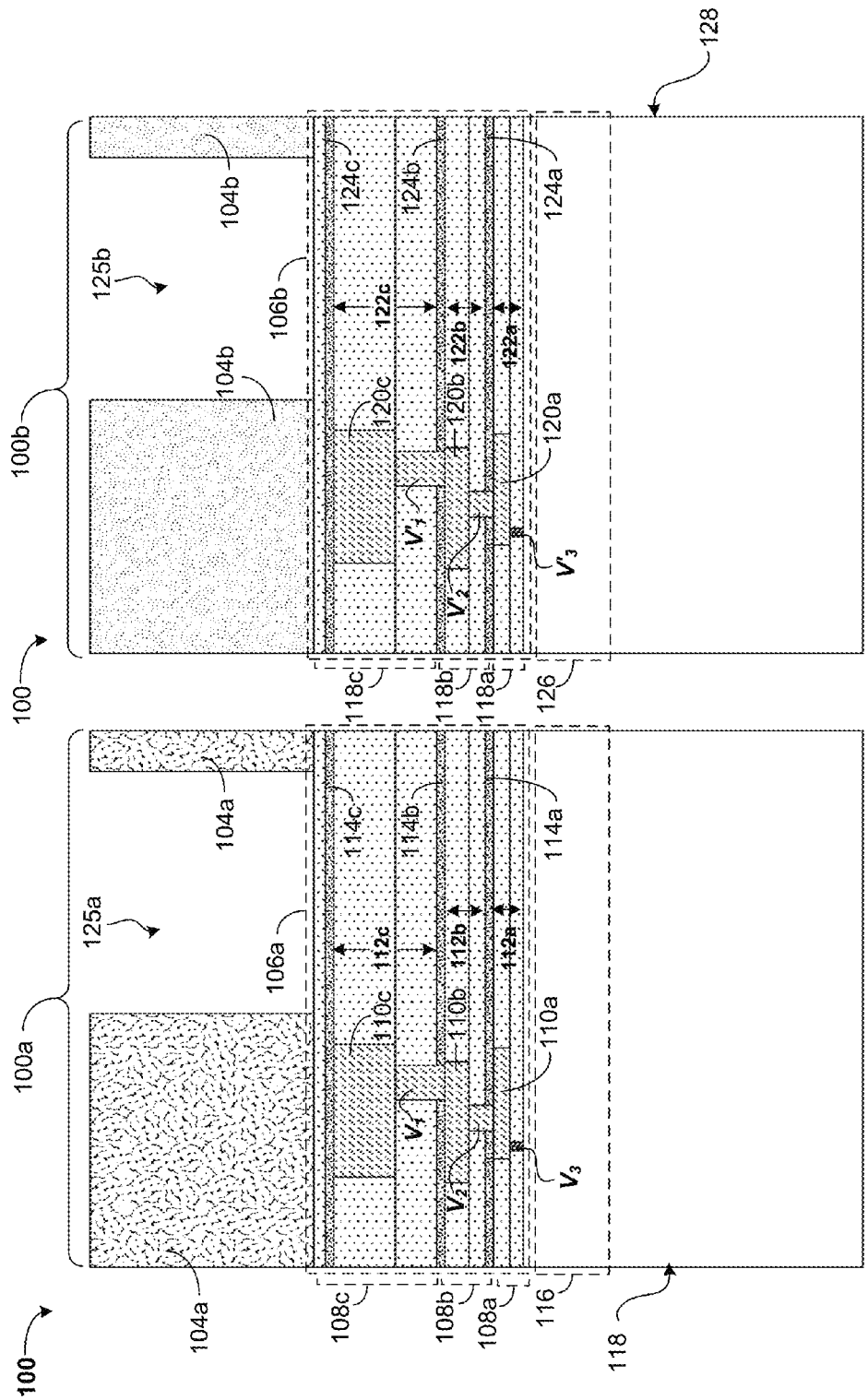

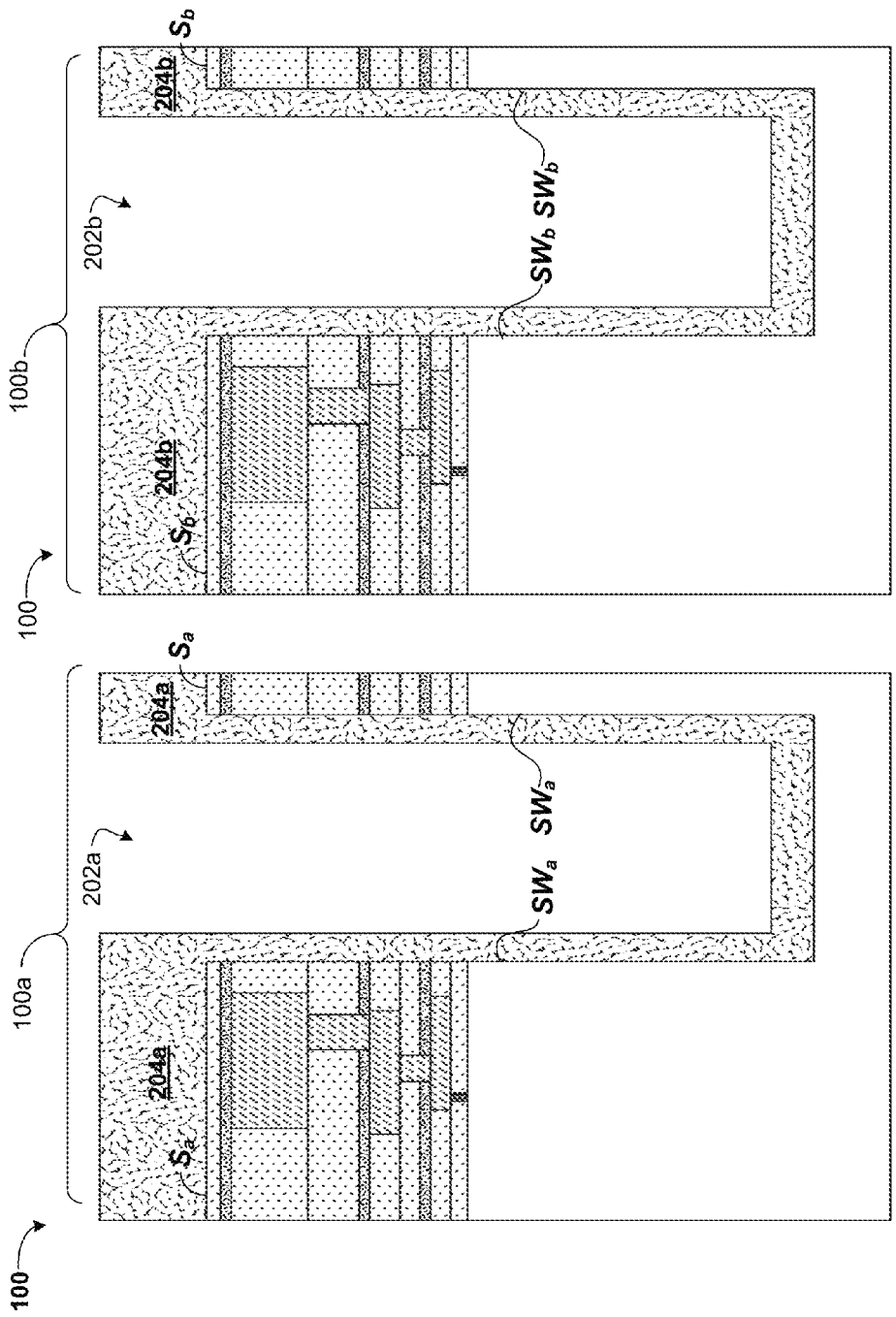

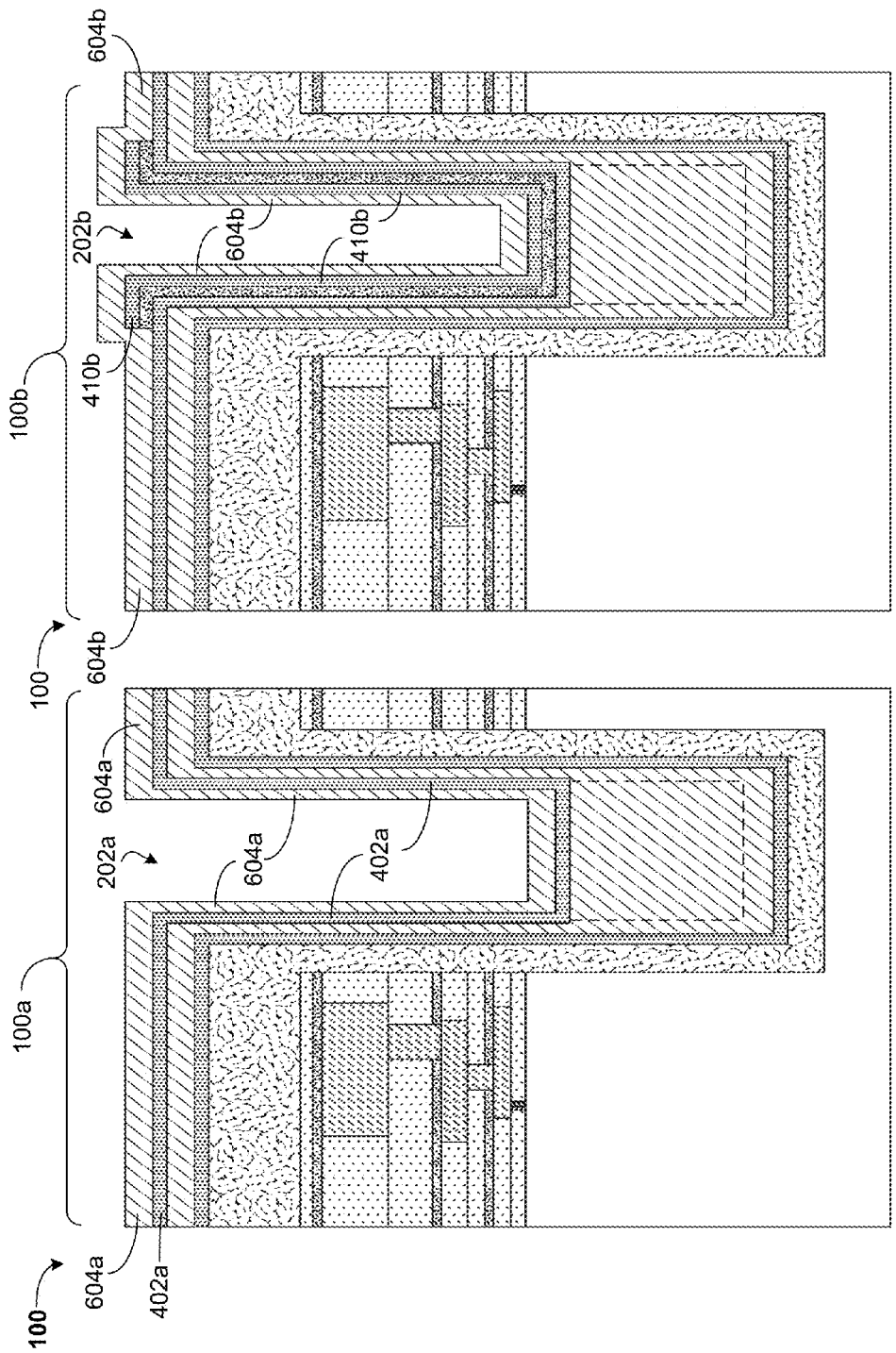

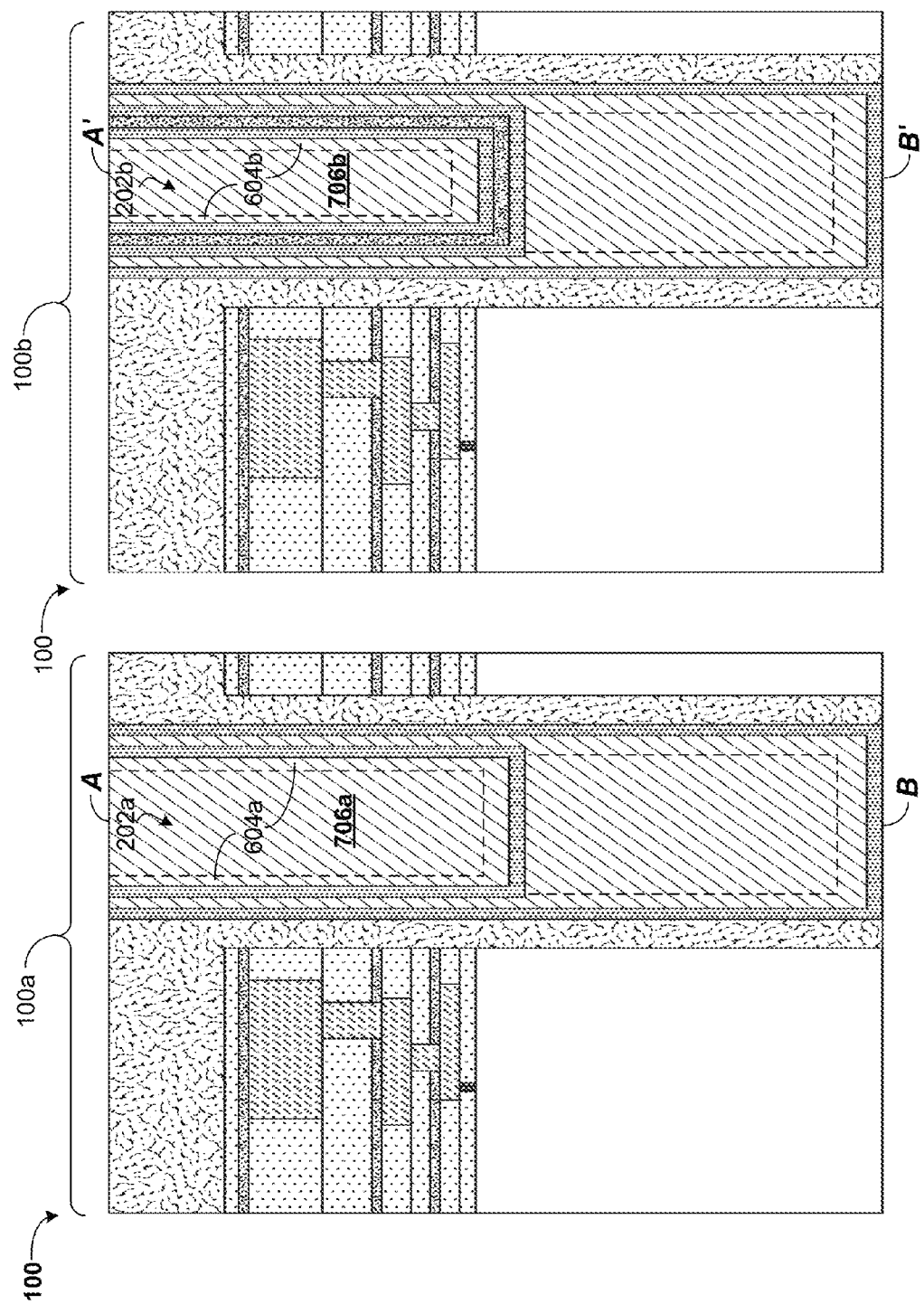

US 9,741,657 B2

TSV DEEP TRENCH CAPACITOR AND ANTI-FUSE STRUCTURE

BACKGROUND a. Field of the Invention

The present invention generally relates to semiconductor devices, and particularly to semiconductor through-silicon-via (TSV) structures.

b. Background of Invention

TSVs may, among other things, be used to provide an electrical connection from one semiconductor chip to another semiconductor chip in a three-dimensional (3D) integration. Within a semiconductor chip, a conventional TSV structure may typically involve forming a trench, creating a liner over the walls of the trench, and subsequently filling the lined trench, for example, entirely with copper (Cu). Other device structures such as fuses, anti-fuses, resistors, and capacitors are normally located away from the formed TSV in, for example, a back-end-of-the-line (BEOL) region of the semiconductor chip.

BRIEF SUMMARY

Accordingly, it may, among other things, be advantageous to form device structures (e.g., capacitors, anti-fuses) within one or more TSV structures fabricated within a semiconductor chip.

According to at least one exemplary embodiment, a through-silicon-via (TSV) structure formed within a trench located within a semiconductor structure is provided. The TSV structure may include a first electrically conductive liner layer located on an outer surface of the trench, a first electrically conductive structure located on the first electrically conductive liner layer such that the first electrically conductive structure partially filling the trench, a second electrically conductive liner layer located on the first electrically conductive structure, a dielectric layer located on the second electrically conductive liner layer, a third electrically conductive liner layer located on the dielectric layer, and a second electrically conductive structure located on the third electrically conductive liner layer and filling a remaining opening of the trench.

According to at least one other exemplary embodiment, a method of forming a through-silicon-via (TSV) within a trench of a semiconductor structure is provided. The method may include forming a first electrically conductive liner layer on an outer surface of the trench, forming a first electrically conductive structure on the first electrically conductive liner layer for partially filling the trench, forming a second electrically conductive liner layer on the first electrically conductive structure, forming a dielectric layer on the second electrically conductive liner layer, forming a third electrically conductive liner layer on the dielectric layer, and forming a second electrically conductive structure on the third electrically conductive liner layer for filling a remaining opening of the trench.

According to at least one other exemplary embodiment, a design structure tangibly embodied in a machine readable medium for designing, manufacturing, or testing an integrated circuit, is provided. The design structure may include a first electrically conductive liner layer located on an outer surface of the trench, a first electrically conductive structure located on the first electrically conductive liner layer such that the first electrically conductive structure partially filling the trench, a second electrically conductive liner layer located on the first electrically conductive structure, a dielectric layer located on the second electrically conductive liner layer, a third electrically conductive liner layer located on the dielectric layer, and a second electrically conductive structure located on the third electrically conductive liner layer and filling a remaining opening of the trench.

BRIEF DESCRIPTION OF THE SEVERAL VIEWS OF THE DRAWINGS

FIGS. 1A and 1B illustrate the formation of TSV trench structures in a semiconductor structure according to one embodiment;

FIGS. 2A and 2B illustrate the formation of an oxide layer within the TSV trench structures depicted in FIGS. 1A and 1B according to one embodiment;

FIGS. 6A and 6B illustrate the deposition of a copper/manganese liner within the TSV trench structures depicted in FIGS. 5A and 5B according to one embodiment;

FIGS. 7A and 7B illustrate the deposition of another copper fill region within the TSV trench structures depicted in FIGS. 6A and 6B in order to form a conventional TSV structure (FIG. 7A) and a TSV deep trench capacitor or anti-fuse (FIG. 7B) according to one embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2C:
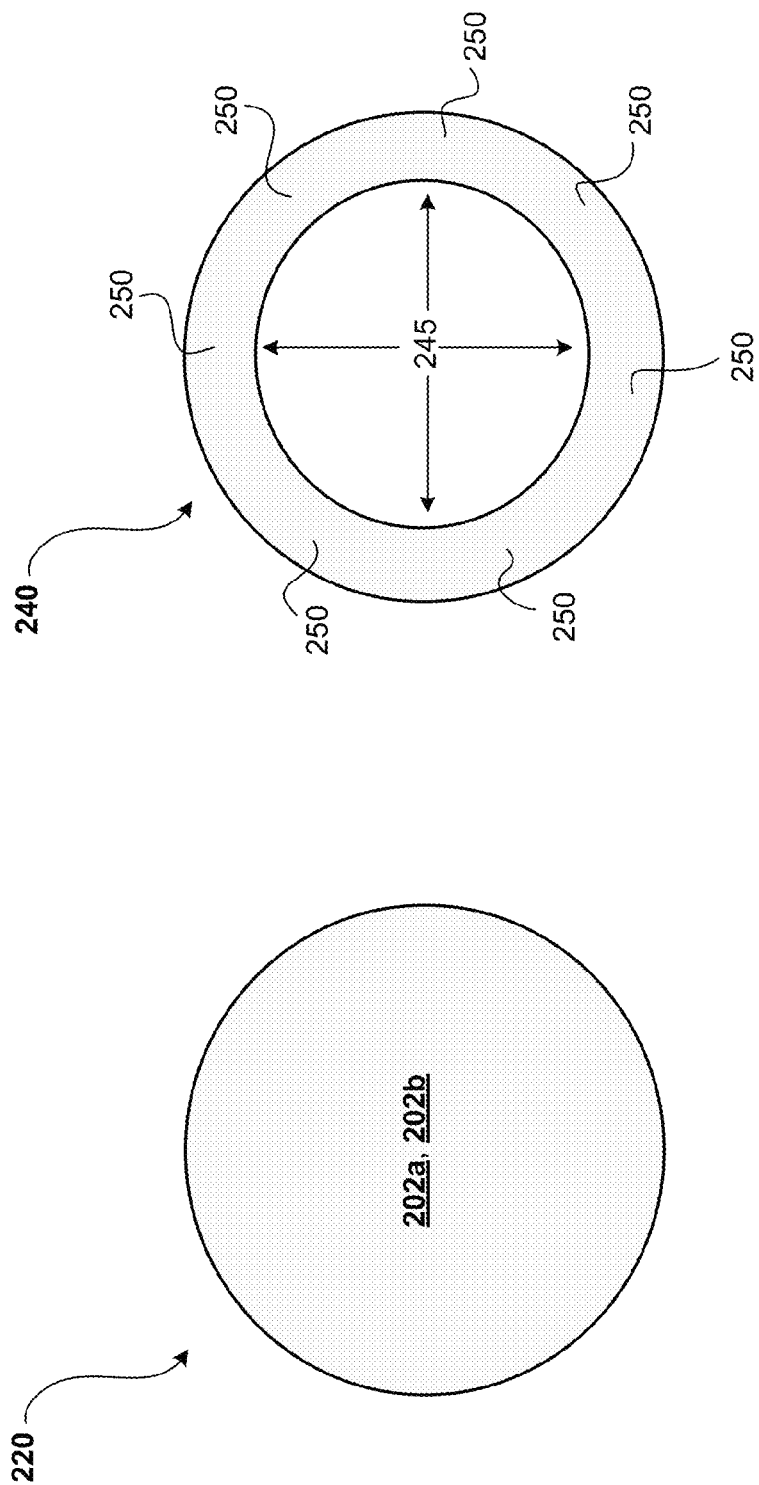
FIG. 2C illustrates a plan view of exemplary trench openings that may be formed according to different embodiments.

The following described exemplary embodiments are directed to forming capacitors and/or anti-fuse devices during the formation of TSV structures used in, for example, a 3D integration.

FIG. 1A is a cross-sectional view that refers to the photolithographic patterning of a region 100a of a semiconductor structure 100 in order to form a TSV structure. FIG. 1B is a cross-sectional view that refers to the photolithographic patterning of another region 100b of the semiconductor structure 100 in order to form a metal-insulator-metal (MIM) capacitor or anti-fuse device during the formation of another TSV structure.

As depicted, the photolithographic process illustrated in both FIGS. 1A and 1B are substantially identical and may be part of the same photolithographic process. Referring to FIG. 1A, the cross-sectional view of region 100a shows a patterned photoresist layer 104a formed over back-end-of-the-line (BEOL) region 106a. The BEOL region 106a may, for example, include metal layers 108a-108c. Each of the metal layers 108a-108c may, for example, include a metal structure, an interlayer dielectric (ILD) layer and a silicon nitride cap layer. Accordingly, metal layer 108a may include metal structure 110a, ILD layer 112a, and silicon nitride cap layer 114a, while metal layer 108b may include metal structure 110b, ILD layer 112b, and silicon nitride cap layer 114b. Also, metal layer 108c may include metal structure 110c, ILD layer 112c, and silicon nitride cap layer 114c. The metal layers 108a-108c forming the BEOL region 106a are formed over a front-end-of-the-line (FEOL) region 116 created from substrate region 118. As depicted, metal layers 108a-108c are electrically coupled by via connections $V_1$-$V_3$. The substrate region 118 may include a silicon-on-insulator structure, a bulk semiconductor structure, or any other suitable structure (e.g., including III-V materials) utilized for manufacturing integrated circuit devices. The devices (e.g., nFET, pFET, etc.) formed within the FEOL region 116 may be electrically interconnected by the BEOL region 106a metal layers 108a-108c.

Similarly, referring to FIG. 1B, the cross-sectional view of region 100b shows a patterned photoresist layer 104b formed over back-end-of-the-line (BEOL) region 106b. The BEOL region 106b may, for example, include metal layers 118a-118c. Each of the metal layers 118a-118c may, for example, include a metal structure, an interlayer dielectric (ILD) layer and a silicon nitride cap layer. Accordingly, metal layer 118a may include metal structure 120a, ILD layer 122a, and silicon nitride cap layer 124a, while metal layer 118b may include metal structure 120b, ILD layer 122b, and silicon nitride cap layer 124b. Also, metal layer 118c may include metal structure 120c, ILD layer 122c, and silicon nitride cap layer 124c. The metal layers 118a-118c forming the BEOL region 106b are formed over a front-end-of-the-line (FEOL) region 126 created from substrate region 128. As depicted, metal layers 118a-118c are electrically coupled by via connections $V'_1$-$V'_3$. The substrate region 128 may include a silicon-on-insulator structure, a bulk semiconductor structure, or any other suitable substrate structure (e.g., including III-V materials) utilized for manufacturing integrated circuit devices. The devices (e.g., nFET, pFET, etc.) formed within the FEOL region 126 may be electrically interconnected by the BEOL region 106b metal layers 118a-118c.

As depicted by FIG. 1A, an opening 125a created by the patterned photoresist layer 104a facilitates the creation of a TSV structure in subsequent processes. Likewise, as depicted by FIG. 1B, an opening 125b created by the patterned photoresist layer 104b subsequently facilitates the creation of a metal-insulator-metal (MIM) capacitor or anti-fuse device within a TSV trench structure. The diameter of the created openings 125a, 125b (FIGS. 1A and 1B) may be about 5-20 μm, although larger or smaller diameters may also be contemplated.

Referring to FIG. 2A, the cross-sectional view of region 100a shows the forming of a TSV trench structure 202a within semiconductor structure 100. This trench structure 202a may be formed by, for example, a reactive ion etching (RIE) process. Similarly, referring to FIG. 2B, the cross-sectional view of region 100b shows the forming of another TSV trench structure 202b within semiconductor structure 100. This trench structure 202b may also be formed by the reactive ion etching (RIE) process utilized for creating trench structure 202a. Following the formation of trenches 202a and 202b, the patterned photoresist layers 104a, 104b (FIGS. 1A and 1B) may be removed. Remaining residue (e.g., polymer residue) may then be removed using, for example, a dilute hydrofluoric acid (DHF) clean process. Trenches 202a and 202b may, for example, have a depth of about 5 μm-100 μm.

Further referring to FIG. 2A, an oxide layer 204a (e.g., silicon dioxide) may be deposited both within the trench structure 202a and the top surface $S_a$ surrounding the trench 202a. The thickness of the oxide layer 204a (e.g., silicon dioxide) on the top surface $S_a$ surrounding the trench 202a may be about 2000 Å-4000 Å, while the thickness of the oxide layer 204a (e.g., silicon dioxide) on the sidewalls $SW_a$ of the trench 202a may be about 1000 Å-2000 Å.

Similarly, referring to FIG. 2B, an oxide layer 204b (e.g., silicon dioxide) may also be deposited both within the trench structure 202b and the top surface $S_b$ surrounding the trench 202b. The thickness of the oxide layer 204b (e.g., silicon dioxide) on the top surface $S_b$ surrounding the trench 202b may be about 2000 Å-4000 Å, while the thickness of the oxide layer 104b (e.g., silicon dioxide) on the sidewalls $SW_b$ of the trench 202b may be about 1000 Å-2000 Å. The deposition of the oxide insulator layers 204a, 204b may be carried out using, for example, a sub-atomic chemical vapor deposition (SACVD) process or a plasma enhanced chemical vapor deposition (PECVD) process.

FIG. 2C depicts a plan view 220 of the formed trenches 202a, 202b shown in FIGS. 2A and 2B. The processes and structures depicted in the subsequent figures (i.e., FIGS. 3-11), assume such exemplary trench 202a, 202b profiles. However, as further illustrated in FIG. 2C, an alternative plan view 240 of a formed trench is shown. According to another exemplary embodiment, the trench 240 may be formed as an annular TSV, whereby the trench opening has an annulus or doughnut shape, as depicted by region 250. The remaining region, as indicated by 245, is constructed from the semiconductor material of the BEOL region. It may be appreciated that, in alternative embodiments, the processes and structures illustrated and described in relation to the depicted figures may also be applied to the alternative trench 240 depicted in FIG. 2C.

Figures 3A, 3B:
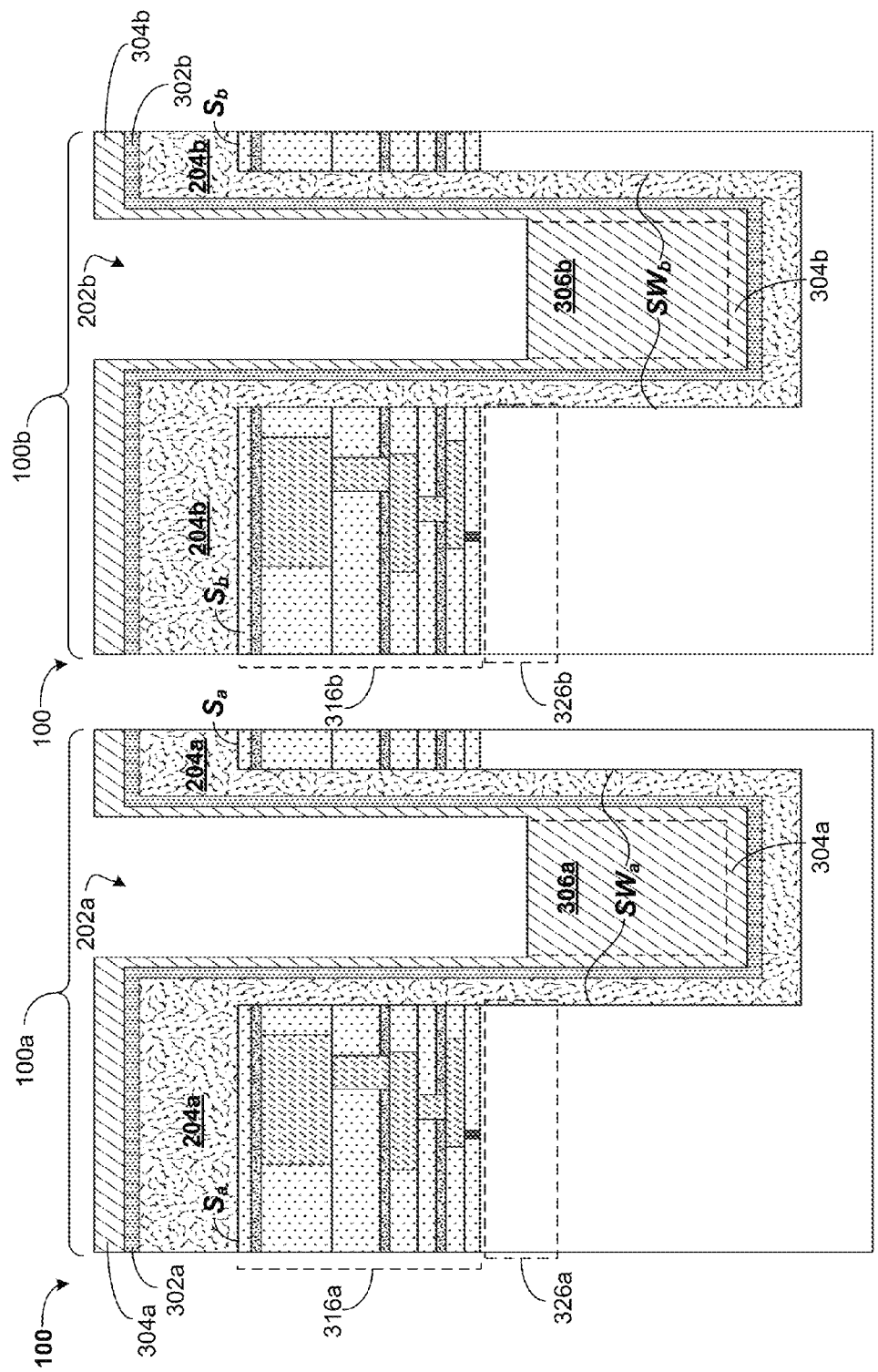
FIGS. 3A and 3B illustrate the formation of a copper fill region within the TSV trench structures depicted in FIGS. 2A and 2B according to one embodiment.

Referring to FIG. 3A, the cross-sectional view of region 100a shows the deposition of a tantalum nitride (TaN) and tantalum (Ta) metallization liner 302a over both the oxide layer 204a (e.g., silicon dioxide) located on the sidewalls $SW_a$ of the trench structure 202a, and over the oxide layer 204a (e.g., silicon dioxide) located above the top surface $S_a$ surrounding the trench 202a. The thickness of the TaN liner within the tantalum nitride (TaN) and tantalum (Ta) metallization liner 302a may be in the region of about 200 Å-300 Å. According to one implementation, the thickness of the TaN liner within tantalum nitride (TaN) and tantalum (Ta) metallization liner 302a may be in the region of about 250 Å, although thicknesses of greater or lesser values may also be contemplated. The thickness of the Ta liner within the tantalum nitride (TaN) and tantalum (Ta) metallization liner 302a may be in the region of about 400 Å-600 Å. According to one implementation, the thickness of the Ta liner within tantalum nitride (TaN) and tantalum (Ta) metallization liner 302a may be in the region of about 500 Å, although thicknesses of greater or lesser values may also be contemplated. Thus, the total thickness of the TaN/Ta liner 302a may be about 600 Å-900 Å. The deposited tantalum nitride (TaN) and tantalum (Ta) metallization liner 302a may serve to inhibit the diffusion of subsequently filled copper within the trench 202a into the BEOL region 316a. Such a copper diffusion may cause electrical shorts within the BEOL electrical connections. Moreover, the deposited tantalum nitride (TaN) and tantalum (Ta) metallization liner 302a may serve to inhibit the diffusion of subsequently filled copper within the trench 202a into the FEOL region 326a. Such a copper diffusion may impair device (e.g., FET devices) operation within the FEOL region located adjacent the trench structure 202a.

Similarly, referring to FIG. 3B, the cross-sectional view of region 100b shows the deposition of a tantalum nitride (TaN) and tantalum (Ta) metallization liner 302b over both the oxide layer 204b (e.g., silicon dioxide) located on the sidewalls $SW_b$ of the trench structure 202b, and over the oxide layer 204a (e.g., silicon dioxide) located above the top surface $S_b$ surrounding the trench 202b. The thickness of the TaN liner within the tantalum nitride (TaN) and tantalum (Ta) metallization liner 302b may be in the region of about 200 Å-300 Å. According to one implementation, the thickness of the TaN liner within tantalum nitride (TaN) and tantalum (Ta) metallization liner 302b may be in the region of about 250 Å, although thicknesses of greater or lesser values may also be contemplated. The thickness of the Ta liner within the tantalum nitride (TaN) and tantalum (Ta) metallization liner 302b may be in the region of about 400 Å-600 Å. According to one implementation, the thickness of the Ta liner within tantalum nitride (TaN) and tantalum (Ta) metallization liner 302b may be in the region of about 500 Å, although thicknesses of greater or lesser values may also be contemplated. Thus, the total thickness of the TaN/Ta liner 302b may be about 600 Å-900 Å. The deposited tantalum nitride (TaN) and tantalum (Ta) metallization liner 302a may serve to inhibit the diffusion of subsequently filled copper within the trench 202b into the BEOL region 316b. Such a copper diffusion may cause electrical shorts within the BEOL electrical connections. Moreover, the deposited tantalum nitride (TaN) and tantalum (Ta) metallization liner 302b may serve to inhibit the diffusion of subsequently filled copper within the trench 202b into the FEOL region 326b. Such a copper diffusion may impair device operation within the FEOL region located adjacent the trench structure 202b.

Referring back to FIG. 3A, a copper (Cu) and manganese (Mn) liner 304a (i.e., a seed layer) is deposited over both the tantalum nitride (TaN) and tantalum (Ta) metallization liner 302a located within the trench structure 202a, and the tantalum nitride (TaN) and tantalum (Ta) metallization liner 302a surrounding the trench 202a. The copper (Cu) and manganese (Mn) liner 304a (i.e., a seed layer) may have a thickness in the range of about 6,000 Å-10,000 Å. According to one implementation, the thickness of the copper (Cu) and manganese (Mn) liner 304a may be about 8000 Å.

Similarly, referring back to FIG. 3B, a copper (Cu) and manganese (Mn) liner 304b (i.e., a seed layer) is deposited over both the tantalum nitride (TaN) and tantalum (Ta) metallization liner 302b located within trench structure 202b, and the tantalum nitride (TaN) and tantalum (Ta) metallization liner 302b surrounding the trench 202b. Copper (Cu) and manganese (Mn) liner 304b (i.e., a seed layer) may also have a thickness in the range of about 6,000 Å-10,000 Å. According to one implementation, the thickness of the copper (Cu) and manganese (Mn) liner 304a may also be about 8000 Å.

As further depicted in FIG. 3A, a copper fill 306a is introduced within the trench 202a using a bottom-up electroplating process. Similarly, further referring to FIG. 3B, a copper fill 306b is also introduced within the trench 202b using bottom-up electroplating. The mixture of copper and manganese within liners 304a and 304b, among other things, mitigates electromigration. As illustrated, some of the copper fill 306a is deposited within the sidewalls of the trench 202a over the copper and manganese liner 304a (i.e., depicted within dashed lines), while some copper fill 306a also accumulates over the copper and manganese liner 304a surrounding the trench 202a. Similarly, some of copper fill 306b is deposited within the sidewalls of trench 202b over the copper and manganese liner 304b (i.e., depicted within dashed lines), while some of the copper fill 306b also accumulates over the copper and manganese liner 304b surrounding the trench 202b.

Figures 4A, 4B:
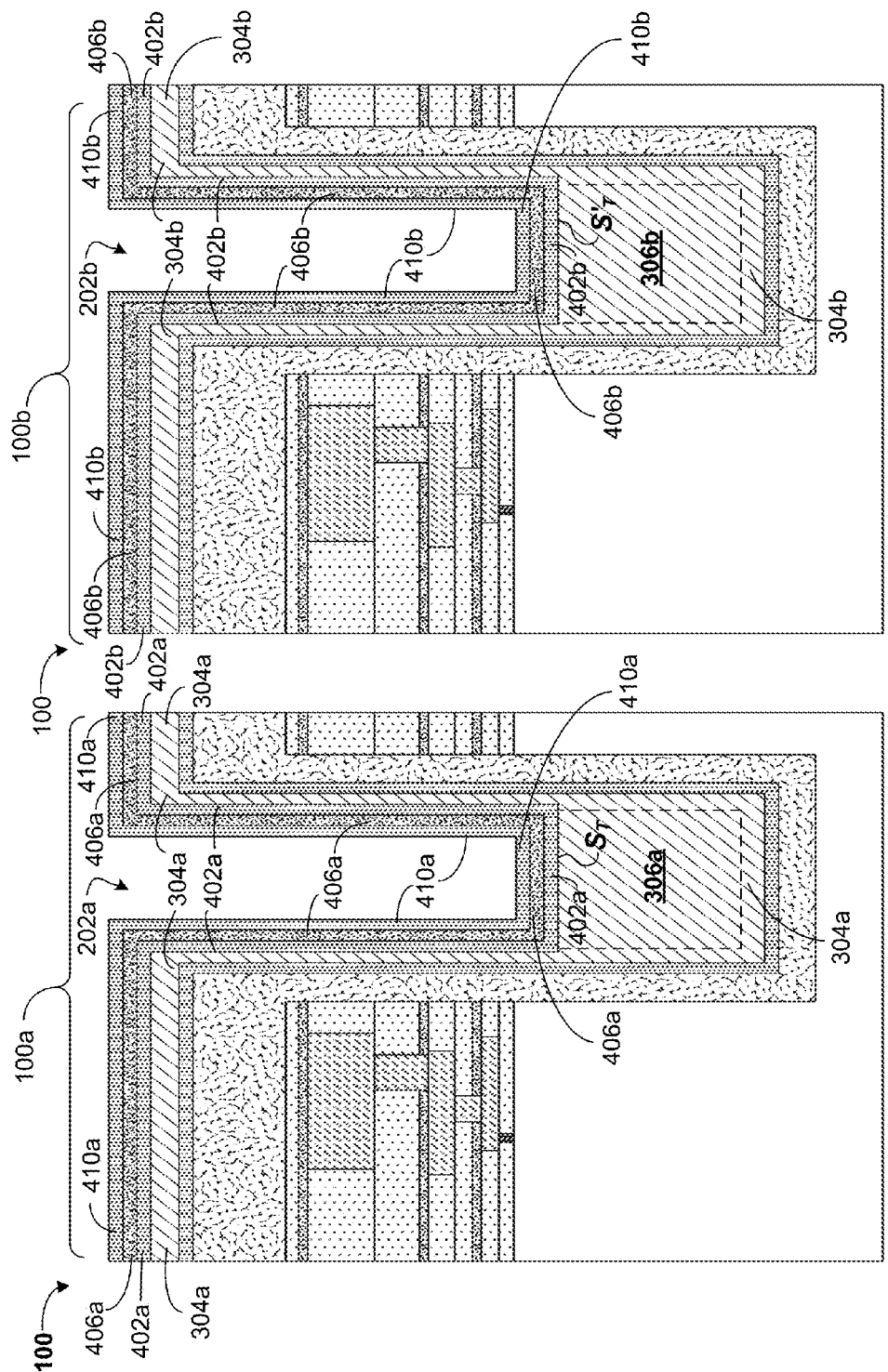
FIGS. 4A and 4B illustrate the formation of metal-insulator-metal region within the TSV trench structures depicted in FIGS. 3A and 3B according to one embodiment.

Referring to FIG. 4A, the cross-sectional view of region 100a shows the deposition of another tantalum nitride (TaN) and tantalum (Ta) metallization liner 402a. More specifically, the tantalum nitride (TaN) and tantalum (Ta) metallization liner 402a is deposited over the copper (Cu) and manganese (Mn) liner 304a located within the trench 202a, over the copper (Cu) and manganese (Mn) liner 304a outside trench 202a, and over the top surface $S_T$ of the copper fill 306a.

Similarly, referring to FIG. 4B, the cross-sectional view of region 100b shows the deposition of tantalum nitride (TaN) and tantalum (Ta) metallization liner 402b. More specifically, the tantalum nitride (TaN) and tantalum (Ta) metallization liner 402b is deposited over the copper (Cu) and manganese (Mn) liner 304b located within the trench 202b, over the copper (Cu) and manganese (Mn) liner 304b outside trench 202b, and over the top surface $S'_T$ of copper fill 306b.

Further referring to FIG. 4A, the cross-sectional view of region 100a shows the deposition of a dielectric layer 406a (i.e., insulator deposition) such as, for example, silicon dioxide (SiO$_2$) or other higher k materials. The dielectric layer 406a may include a thickness of about 100 Å-1000 Å, although greater or lesser thicknesses may be contemplated based on component application (e.g., capacitor or antifuse). More specifically, the dielectric layer 406a is deposited over the tantalum nitride (TaN) and tantalum (Ta) metallization liner 402a located within the trench 202a, and over the tantalum nitride (TaN) and tantalum (Ta) metallization liner 402a outside trench 202a.

Similarly, further referring to FIG. 4B, the cross-sectional view of region 100b shows the deposition of a dielectric layer 406b (i.e., insulator deposition) such as, for example, silicon dioxide (SiO$_2$) or other higher k materials. The dielectric layer 406b may also include a thickness of about 100 Å-1000 Å, although greater or lesser thicknesses may be contemplated based on component application (e.g., capacitor or anti-fuse). More specifically, the dielectric layer 406b is deposited over the tantalum nitride (TaN) and tantalum (Ta) metallization liner 402b located within the trench 202b, and over the tantalum nitride (TaN) and tantalum (Ta) metallization liner 402b outside trench 202b.

Still referring to FIG. 4A, the cross-sectional view of region 100a shows the deposition of yet another tantalum nitride (TaN) and tantalum (Ta) metallization liner 410a. More specifically, the tantalum nitride (TaN) and tantalum (Ta) metallization liner 410a is deposited over the dielectric layer 406a located within the trench 202a, and over the dielectric layer 406a outside trench 202a. Similarly, referring to FIG. 4B, the cross-sectional view of region 100b also shows the deposition of yet another tantalum nitride (TaN) and tantalum (Ta) metallization liner 410b. More specifically, the tantalum nitride (TaN) and tantalum (Ta) metallization liner 410b is also deposited over the dielectric layer 406b located within trench 202b, and over the dielectric layer 406b outside trench 202b.

As shown in FIG. 4A, the depicted tantalum nitride (TaN) and tantalum (Ta) metallization liner 402a that is separated by dielectric layer 406a from tantalum nitride (TaN) and tantalum (Ta) metallization liners 410a, forms a metal-insulator-metal (MIM) structure used in the subsequent formation of a capacitor or an anti-fuse device. Similarly, as shown in FIG. 4B, the depicted tantalum nitride (TaN) and tantalum (Ta) metallization liner 402b that is separated by dielectric layer 406b from tantalum nitride (TaN) and tantalum (Ta) metallization liner 410b, may also form a metal-insulator-metal (MIM) structure used in the subsequent formation of a capacitor or an anti-fuse device. As previously described, the thickness of the TaN liner within the tantalum nitride (TaN) and tantalum (Ta) metallization liners 402a, 410a, 402b, 410b may be in the region of about 200 Å-300 Å. According to one implementation, the thickness of the TaN liners within the tantalum nitride (TaN) and tantalum (Ta) metallization liners 402a, 410a, 402b, 410b may be in the region of about 250 Å, although thicknesses of greater or lesser values may also be contemplated. The thickness of the Ta liners within the tantalum nitride (TaN) and tantalum (Ta) metallization liners 402a, 410a, 402b, 410b may be in the region of about 400 Å-600 Å. According to one implementation, the thickness of the Ta liner within the tantalum nitride (TaN) and tantalum (Ta) metallization liners 402a, 410a, 402b, 410b may be in the region of about 500 Å, although thicknesses of greater or lesser values may also be contemplated. Thus, the total thickness of TaN/Ta liners 402a, 410a, 402b, and 410b may each be about 600 Å-900 Å. Also, as previously described, the dielectric layer 406b may include a thickness of about 100 Å-1000 Å. For example, in some implementations, the dielectric layer 406b may be about 500 Å thick, while in other implementations the dielectric layer 406b may have a thickness of about 100 Å.

Figures 5A, 5B:
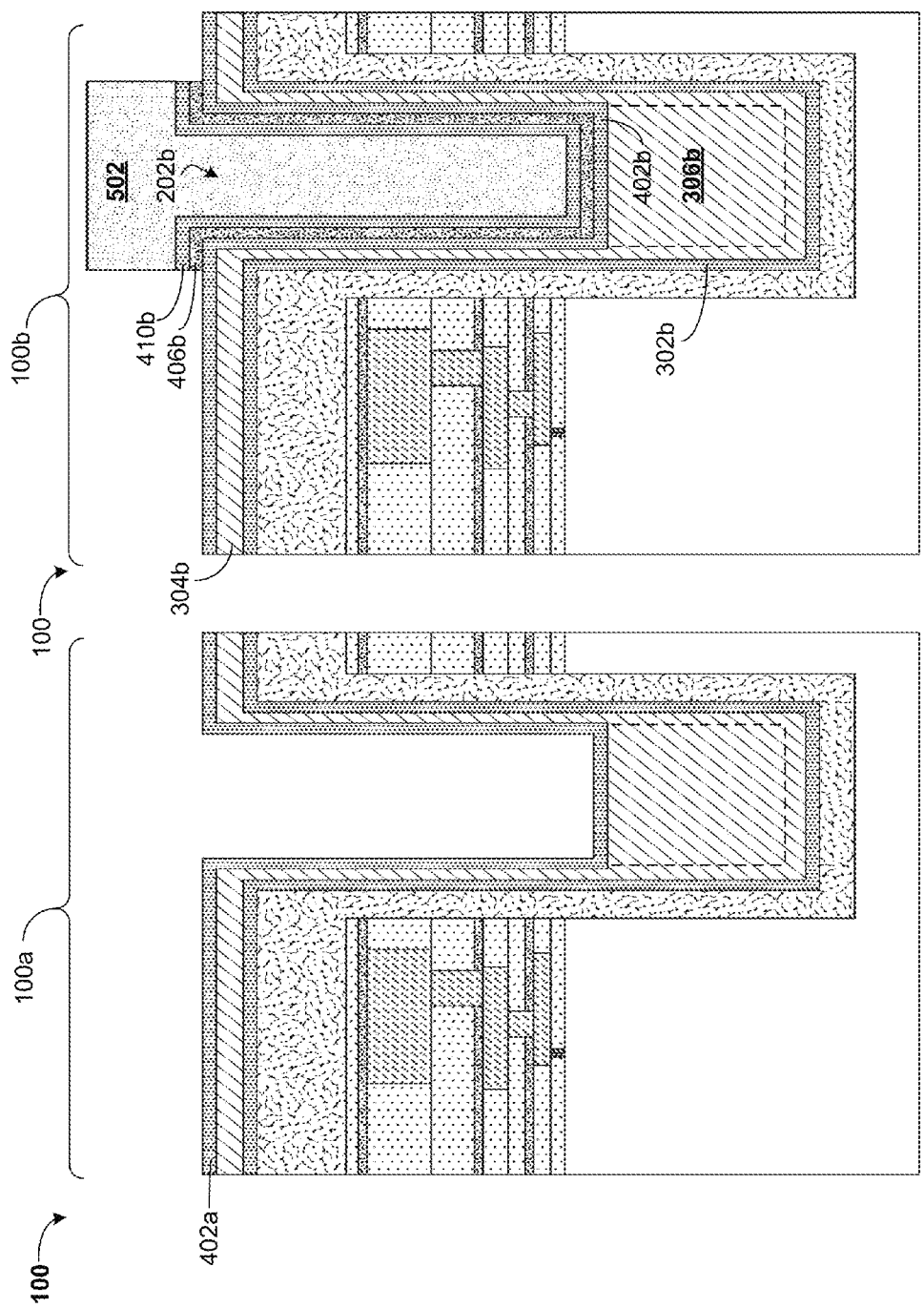
FIGS. 5A and 5B illustrate the removal of the metal and insulator region from the TSV trench structure depicted in FIG. 4A according to one embodiment.

Referring to FIG. 5A, the cross-sectional view of region 100a shows the removal (e.g., via a RIE etch) of the tantalum nitride (TaN) and tantalum (Ta) metallization liner 410a (FIG. 4A), and the removal of dielectric layer 406a (FIG. 4A). However, as depicted in FIG. 5B, patterned photoresist layer 502 preserves both the tantalum nitride (TaN) and tantalum (Ta) metallization liner 410b within region 100b, and the dielectric layer 406b within region 100b, during the region 100a etching of liner 410a (FIG. 4A) and dielectric layer 406a (FIG. 4A). Thus, since the structure corresponding to region 100a may be subsequently used to form a conventional TSV structure, liner 410a and dielectric layer 406a is accordingly removed. However, because the structure corresponding to region 100b may be subsequently used to form a device (e.g., capacitor or anti-fuse) during the TSV structure formation process, liner 410b and dielectric layer 406b is accordingly preserved. More specifically, for example, the liner 410b may form part of the top plate of a capacitor created within trench 202b of region 100b, while the dielectric layer 406b forms the dielectric utilized to electrically insulate the top plate (subsequently formed) from the bottom plate of the capacitor. The bottom plate may include the formed tantalum nitride (TaN) and tantalum (Ta) metallization liner 302b, the copper (Cu) and manganese (Mn) liner 304b, the copper fill 306b, and tantalum nitride (TaN)/tantalum (Ta) metallization liner 402b.

Referring to FIG. 6A, the cross-sectional view of region 100a shows the deposition of the copper (Cu) and manganese (Mn) liner 604a. More specifically, the copper (Cu) and manganese (Mn) liner 604a is deposited over the tantalum nitride (TaN) and tantalum (Ta) metallization liner 402a located within trench 202a, and over the tantalum nitride (TaN) and tantalum (Ta) metallization liner 402a outside trench 202a. As previously described, the copper (Cu) and manganese (Mn) liner 604a (i.e., a seed layer) may also have a thickness in the range of about 6000 Å-10000 Å. According to one implementation, the thickness of the copper (Cu) and manganese (Mn) liner 604a may also be about 8000 Å.

Referring to FIG. 6B, the cross-sectional view of region 100b depicts that upon the removal (e.g., a dry or wet etch) of patterned resist layer 502 (FIG. 5B), copper (Cu) and manganese (Mn) liner 604b is deposited over the tantalum nitride (TaN) and tantalum (Ta) metallization liner 410b located within trench 202b, and over the partial tantalum nitride (TaN) and tantalum (Ta) metallization liner 410b located outside trench 202b. Also, the copper (Cu) and manganese (Mn) liner 604b (i.e., a seed layer) may also have a thickness in the range of about 6000 Å-10000 Å. According to one implementation, the thickness of the copper (Cu) and manganese (Mn) liner 604b may also be about 8000 Å.

Referring to FIG. 7A, a copper fill 706a is introduced within the trench 202a using a bottom-up electroplating process. Similarly, referring to FIG. 7B, a copper fill 706b is also introduced within the trench 202b using bottom-up electroplating. As depicted in FIGS. 7A and 7B, copper fill 706a within trench 202a is formed over the deposited copper (Cu) and manganese (Mn) liner 604a, while copper fill 706b within trench 202b is formed over the deposited copper (Cu) and manganese (Mn) liner 604b. Accordingly, the formed TSV structure of region 100a provides an electrically conductive connection between the opposing surfaces A and B of semiconductor structure 100. However, concurrently with the formation of the TSV structure of region 100a, a deep trench capacitor or anti-fuse structure may be formed in region 100b between opposing surfaces A' and B' of semiconductor structure 100. As illustrated, some of the copper fill 706a is deposited within the sidewalls of the trench 202a over the copper and manganese liner 604a (i.e., depicted within dashed lines), while some copper fill 706a also accumulates (not shown) over the copper and manganese liner 604a surrounding the trench 202a. Similarly, some of copper fill 706b is deposited within the sidewalls of trench 202b over the copper and manganese liner 604b (i.e., depicted within dashed lines), while some of the copper fill 706b also accumulates (also not shown) over the copper and manganese liner 304b surrounding the trench 202b.

Referring to FIG. 8, a deep trench capacitor structure 800 may be formed using the processes described above in relation to FIGS. 1-8. Within a single substantially vertical trench 202b, the deep trench capacitor 800 includes a bottom plate formed by TaN/Ta metallization liner 302b, Cu/Mn liner 304b, copper fill region 306b, and TaN/Ta metallization liner 402b. Within the single substantially vertical trench 202b, the deep trench capacitor 800 also includes a top plate formed by TaN/Ta metallization liner 410b, Cu/Mn liner 604b, and copper fill region 706b. Also, within the single substantially vertical trench 202b, the top and the bottom plates are vertically and horizontally separated by dielectric layer 406b. Based on the dielectric layer 406b electrically insulating the top and the bottom plates, structure 800 may function as a capacitor device. However, in some implementation, the dielectric layer 406b electrically insulating the top and the bottom plates may be designed to breakdown when certain voltage values are applied to the top and the bottom plates. Under such conditions, the top and the bottom plates are electrically coupled through the broken down dielectric layer 406b. Thus, structure 800 may then function as an anti-fuse device, whereby, under dielectric breakdown conditions, the top and bottom plates are electrically shorted together.

Figure 8:
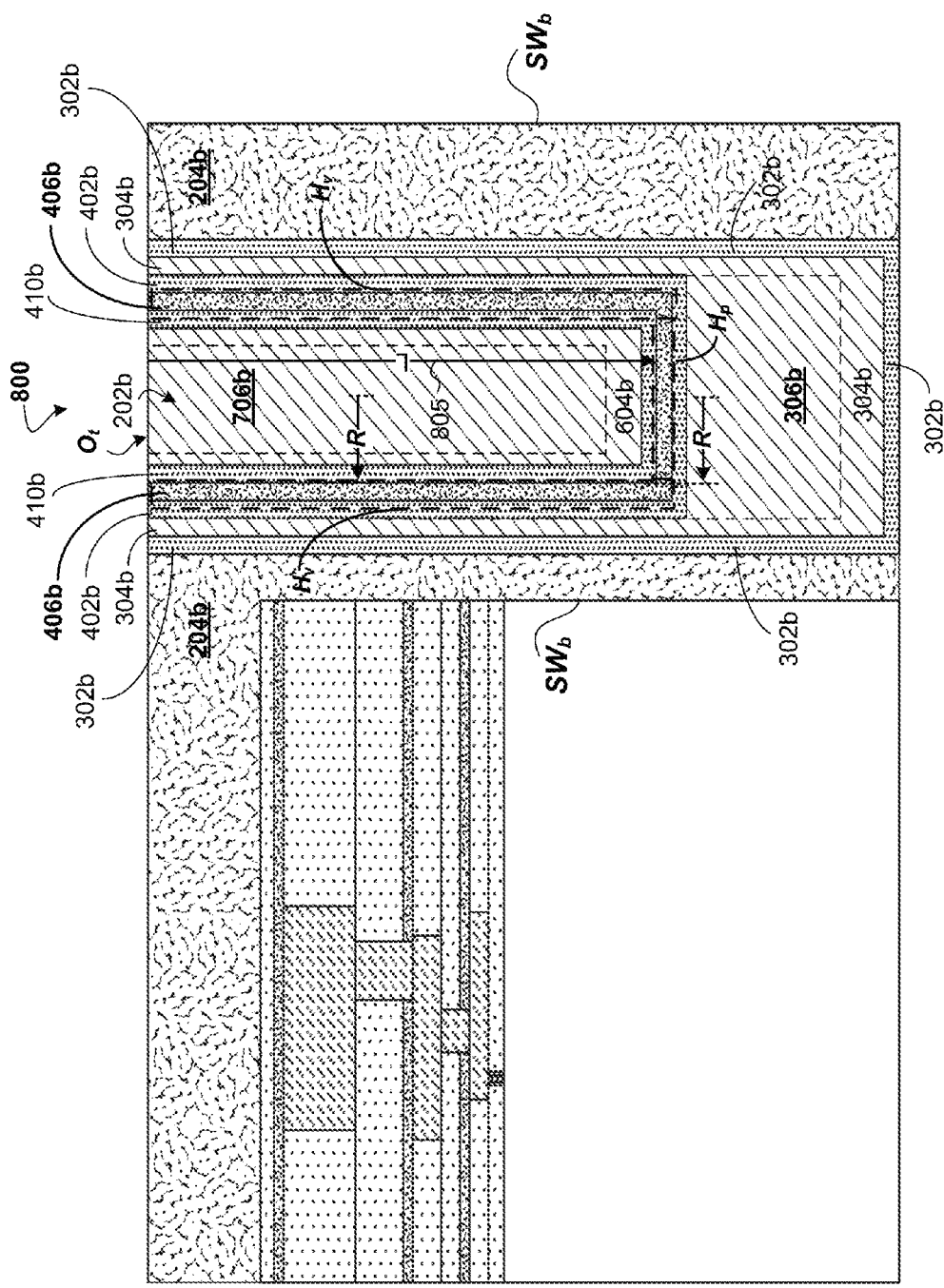
FIG. 8 depicts a formed TSV deep trench capacitor structure according to one embodiment.

The structure in FIG. 8 may include a capacitance value based on the general capacitor equation, given by:

$$C = \frac{\varepsilon A}{d} \qquad \text{Equation 1}$$

Whereby C is the capacitance value, d is the dielectric thickness separating the capacitor plates, and A is the area of the capacitor plates. Also, $\varepsilon$ is equivalent to $k\varepsilon_0$, where k is the relative permittivity of the dielectric and $\varepsilon_0$ is the permittivity of free space (i.e., $\varepsilon_0=8.854\times10^{-12}$ F/m). Equation 1 may be used to determine the capacitance value for structure 800.

As depicted in FIG. 8, two capacitances contribute to the overall capacitance of the capacitor structure 800 formed within trench 202b. For example, a first capacitance (C1) is formed with respect to the horizontal portion $H_p$ of the dielectric layer 406b located between the opposing sidewall $SW_b$ of the trench 202b, while a second capacitance (C2) is formed with respect to the vertical portion $H_v$ of the dielectric layer 406b located substantially parallel to the opposing sidewall $SW_b$ of the trench 202b. The net capacitance of structure 800 may be accordingly determined to be C=C1+C2, which is the parallel configuration of capacitances C1 and C2.

The first capacitance (C1) formed with respect to the horizontal portion $H_p$ of the dielectric layer 406b may be created between the opposing surfaces of the TaN/Ta metallization liners 402b, 410b that are located either side of the horizontal portion $H_p$. Here, the capacitor plates are, in part, formed by the surfaces of the TaN/Ta metallization liners 402b, 410b that are located either side of the horizontal portion $H_p$. Assuming a substantially circular trench shape, the area (A) of each of the capacitor plates may be $\pi R^2$, where R is the radius of the opposing surfaces of TaN/Ta metallization liners 402b and 410b located either side of the horizontal portion $H_p$. The distance (d) between the plates is governed by the thickness of the dielectric layer 406b separating the plates. Thus, for a particular dielectric material (e.g., k=2.7), C1 may be calculated using Equation (1).

The second capacitance (C2) formed with respect to the vertical portion $H_v$ of the dielectric layer 406b may be created between the opposing surfaces of the TaN/Ta metallization liners 402b, 410b that are located either side of the vertical portion $H_v$. Here, one capacitor plate is formed, in part, by the outer surface of a cylinder formed by TaN/Ta metallization liner 410b. The other capacitor plate is formed, in part, by the inner surface of a cylinder formed by TaN/Ta metallization liner 402b. Assuming a substantially circular trench shape, the area (A) of each of the cylindrical plates may be approximately given by $(2\pi R)L$, where R is the outer radius of the cylindrical plate formed, in part, by TaN/Ta metallization liner 410b along the vertical portion $H_v$. L (as depicted by 805) is the height of the vertical portion $H_v$ between the opening $O_t$ of the trench 202b and the upper surface of horizontal portion $H_p$ of the dielectric layer 406b. The distance (d) between the plates is also governed by the thickness of the dielectric layer 406b separating the plates. Thus, for a particular dielectric material (e.g., k=2.7), C2 may also be calculated using Equation (1).

Based on the structure 800 illustrated in FIG. 8, the following numerical examples are provided. Thus, for R=5 μm, L=10 μm, d=500 Å, and k=2.7, using Equation (1), C1 may be calculated to be about 37.5 fF. As described above, for C1, the plate area A is given by $\pi R^2$. Also, using Equation (1), C2 may be calculated to be about 150 fF. As described above, for C2, the plate area A is given by $2\pi RL$. Accordingly, the total capacitance of structure 800 (i.e., C) is calculated to be 187.5 fF (i.e., C=C1+C2). In another example, using Equation (1), for R=10 μm, L=100 μm, d=100 Å, and k=2.7, C1 may be calculated to be about 751 fF. Also, using Equation (1), C2 may be calculated to be about 15013 fF. Therefore, by reducing the dielectric layer thickness (d) and increasing the area (A) of the top plate of the capacitor, the capacitance may be significantly increased, as illustrated by the above examples.

Figure 9:
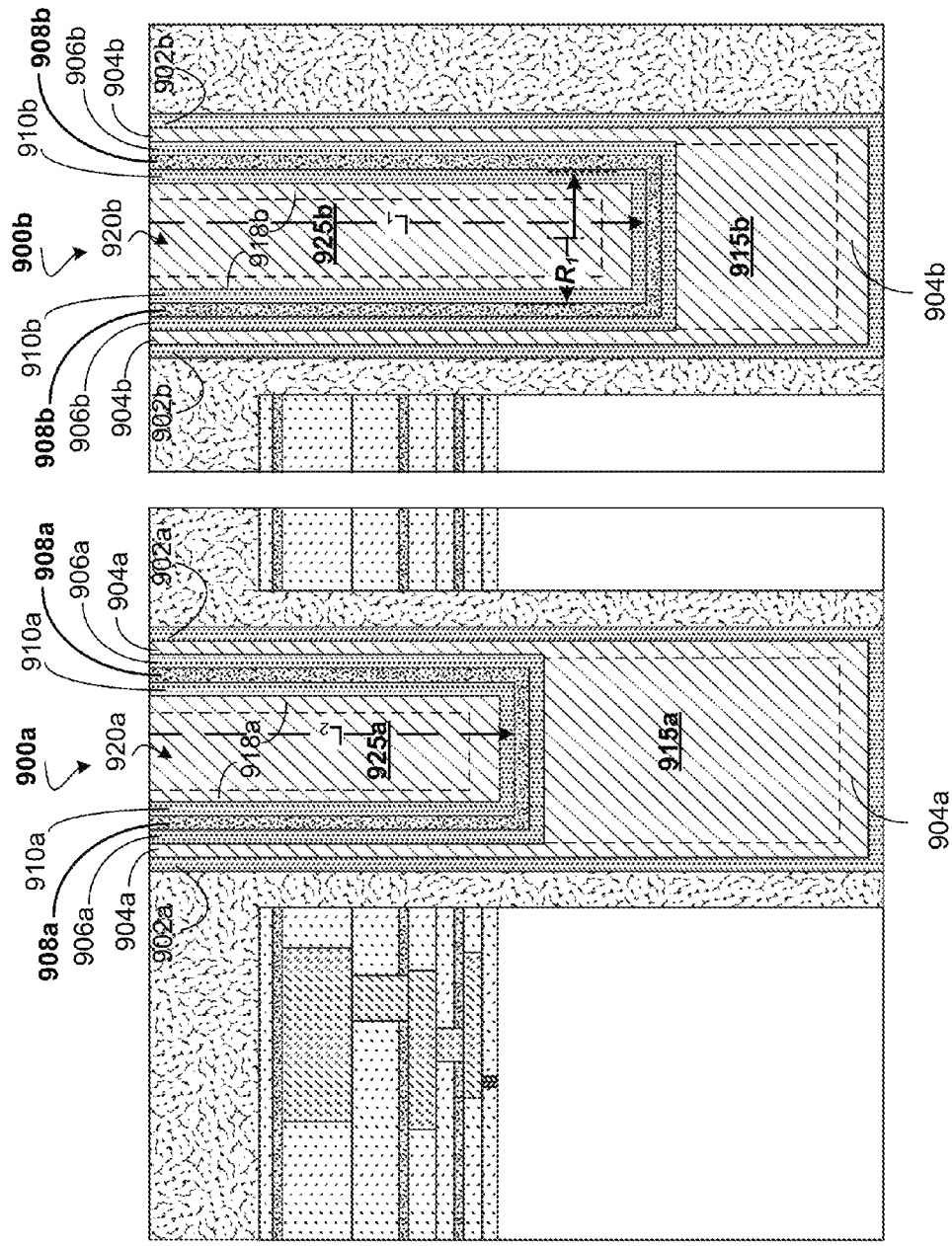
FIG. 9 depicts formed TSV deep trench capacitor structures having different capacitance values according to one embodiment.

Referring to FIG. 9, two deep trench capacitor structures 900a, 900b having different capacitance values may be formed on separate wafers using the processes described above in relation to FIGS. 1-7. Within a single substantially vertical trench 920a, the deep trench capacitor 900a may include a bottom plate formed by TaN/Ta metallization liner 902a, Cu/Mn liner 904a, copper fill region 915a, and TaN/Ta metallization liner 906a. Within the single substantially vertical trench 920a, the deep trench capacitor 900a also includes a top plate formed by TaN/Ta metallization liner 910a, Cu/Mn liner 918a, and copper fill region 925a. Also, within the single substantially vertical trench 920a, the top and the bottom plates are vertically and horizontally separated by dielectric layer 908a. Similarly, within another single substantially vertical trench 920b, the deep trench capacitor 900b may include a bottom plate formed by TaN/Ta metallization liner 902b, Cu/Mn liner 904b, copper fill region 915b, and TaN/Ta metallization liner 906b. Within the single substantially vertical trench 920b, the deep trench capacitor 900b also includes a top plate formed by TaN/Ta metallization liner 910b, Cu/Mn liner 918b, and copper fill region 925b. Also, within the single substantially vertical trench 920b, the top and the bottom plates are vertically and horizontally separated by dielectric layer 908b.

As depicted in FIG. 9, by changing the feature size or sizes of one capacitor compared to the other, their respective capacitance values may be varied. For example, capacitor structure 900b has a higher capacitance compared to capacitor structure 900a. In the depicted example, capacitor structure 900b is formed with a top plate having an increased top plate area ($A_1=2\pi R_1 L_1$) compared to capacitor structure 900a. This may be achieved by increasing the depth of the top plate within trench 920b, as indicated by $L_1$, relative to trench 920a, as indicated by $L_2$.

Figure 10:
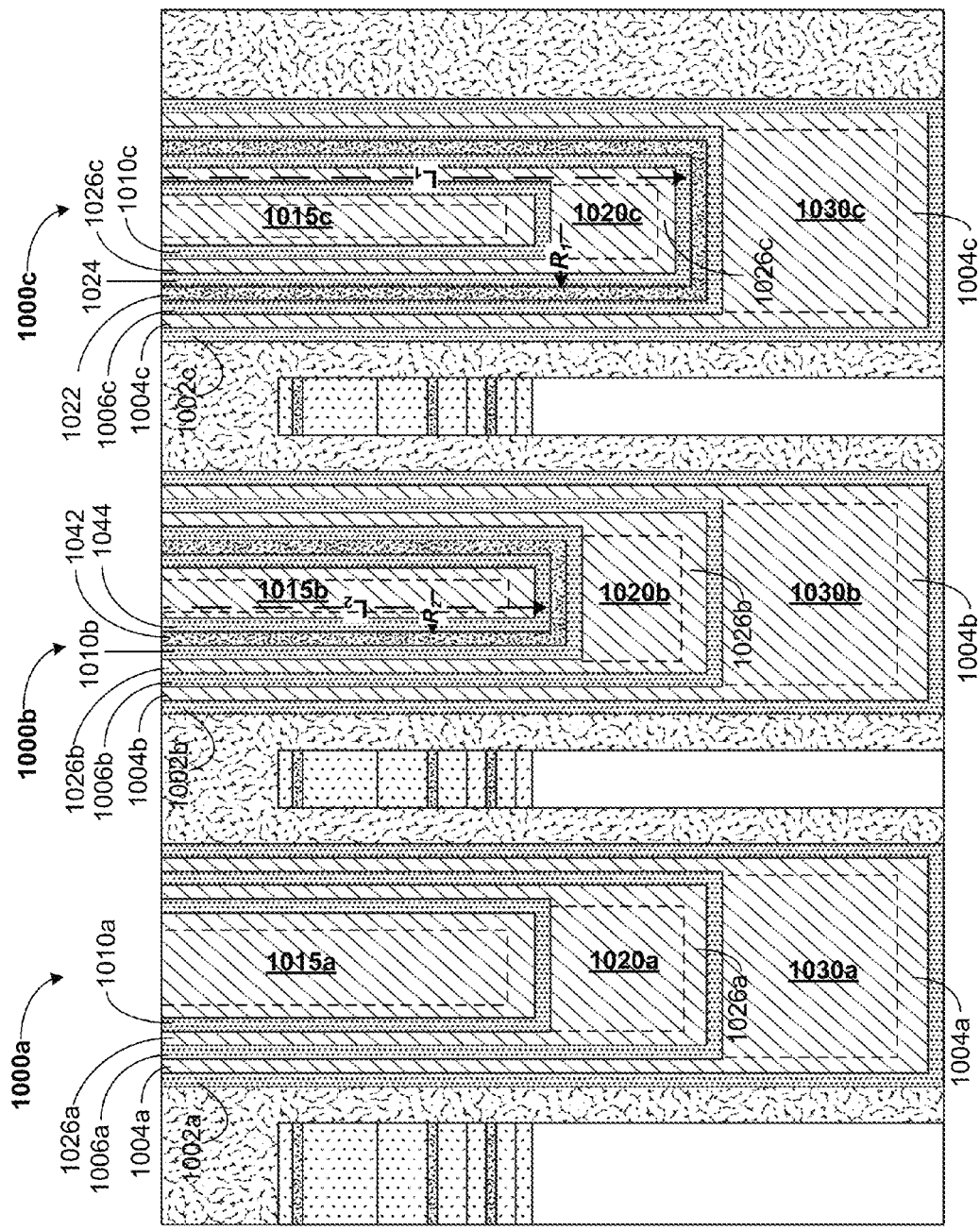
FIG. 10 depicts a formed conventional TSV structure and TSV deep trench capacitor structures having different capacitance values according to another embodiment.

FIG. 10 depicts an exemplary embodiment of a formed conventional TSV 1000a structure, and TSV deep trench capacitor structures 1000b and 1000c having different capacitance values. Using the processes described above in relation to FIGS. 1-7, in all three structures 1000a, 1000b, 1000c, the TaN/Ta liners 1002a, 1002b, 1002c, the Cu/Mn liners 1004a, 1004b, 1004c, and the copper fill regions 1030a, 1030b, 1030c are formed concurrently. Also, TaN/Ta liners 1006a, 1006b, and 1006c are formed during the formation of the MIM structure within deep trench capacitor structure 1000c. As depicted, the MIM structure within deep trench capacitor structure 1000c may include TaN/Ta liner 1006c, dielectric layer 1022, and TaN/Ta liner 1024. The MIM structure having TaN/Ta liner 1006c, dielectric layer 1022, and TaN/Ta liner 1024 may be formed by masking structure 1000c, and etching structures 1000a and 1000b in a similar manner to the process described in relation to FIGS. 5A and 5B. Based on this mask and etch process, in structures 1000a and 1000b, TaN/Ta liners 1006a and 1006b remain.

Subsequently, as further shown in FIG. 10, in all three structures 1000a, 1000b, 1000c, Cu/Mn liners 1026a, 1026b, and 1026c, and copper fill regions 1020a, 1020b, and 1020c are formed concurrently. As further depicted, the MIM structure within deep trench capacitor structure 1000b may include TaN/Ta liner 1010b, dielectric layer 1042, and TaN/Ta liner 1044. The MIM structure having TaN/Ta liner 1010b, dielectric layer 1042, and TaN/Ta liner 1044 may be formed by masking structure 1000b and etching structures 1000a and 1000c in a manner also similar to the process described in relation to FIGS. 5A and 5B. Based on this mask and etch process, in structures 1000a and 1000c, TaN/Ta liners 1010a and 1010c remain. Copper fill regions 1015a, 1015b, and 1015c are then formed to create TSV structure 1000a, deep trench capacitor structure 1000b, and deep trench capacitor 1000c.

In FIG. 10, deep trench capacitor 1000c has a higher capacitance value compared to deep trench capacitor 1000b. This may be due to the increased top plate area of deep trench capacitor 1000c, which is defined by copper fill 1015c, TaN/Ta liner 1010c, Cu/Mn liner 1026c, copper fill 1020c, and TaN/Ta liner 1024. The top plate of deep trench capacitor 1000b may include copper fill 1015b and TaN/Ta liner 1044. As previously described, the top plate area A may be given by $2\pi RL$, whereby for deep trench capacitor 1000b the top plate area is $2\pi R_2 L_2$, while for deep trench capacitor 1000c the top plate area is $2\pi R_1 L_1$. Since both $L_1$ and $R_1$ are greater than $L_2$ and $R_2$, the area of the top plate of deep trench capacitor 1000c is accordingly greater than the area of the top plate of deep trench capacitor 1000b. Thus, based on Equation (1), the increased top plate area will generate a greater capacitance value.

Accordingly, the embodiment of FIG. 10 illustrates the use of the processes depicted and described in FIGS. 1-7 for the purpose of generating deep trench capacitors of different capacitance values during TSV formation.

Figure 11:
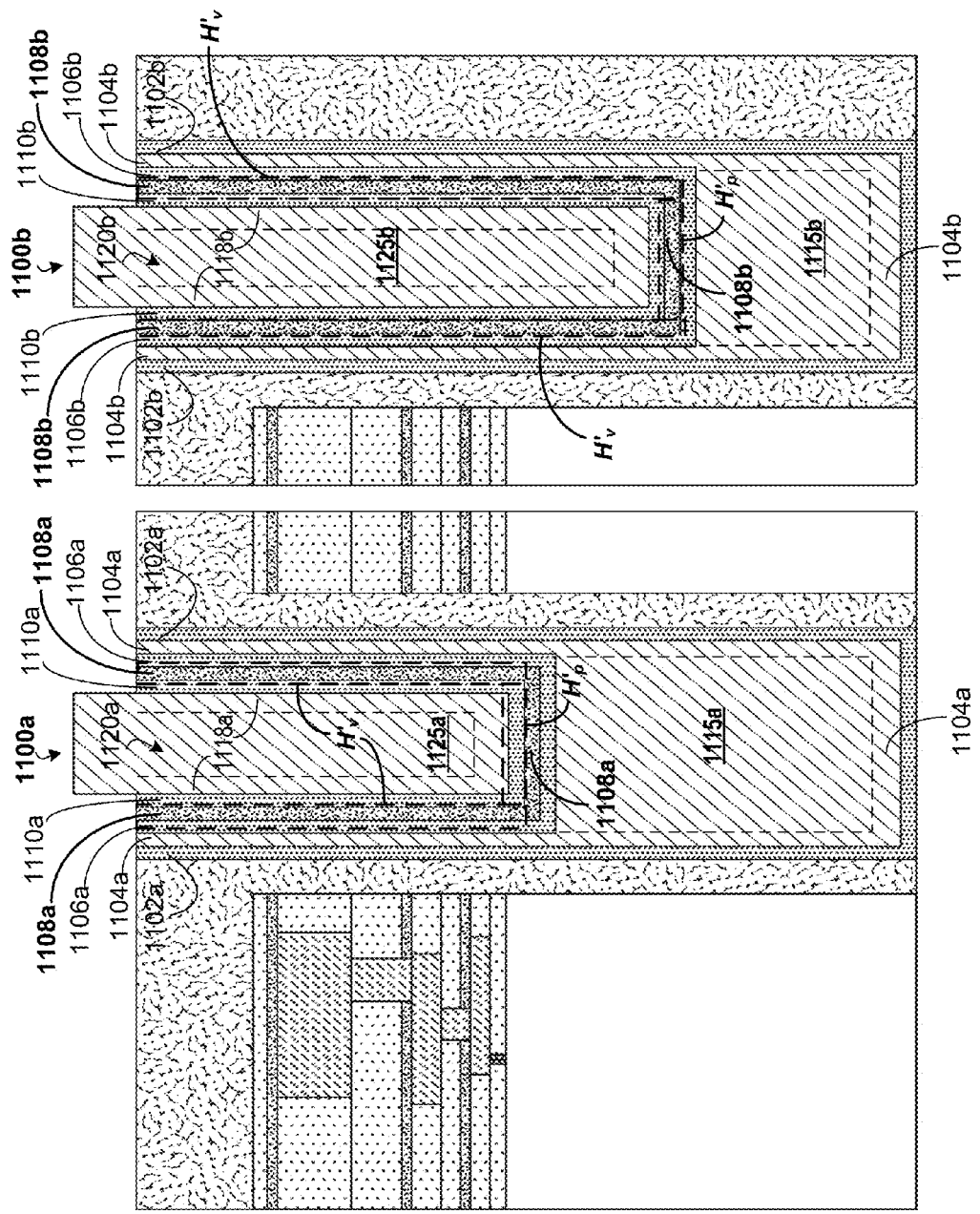
FIG. 11 depicts formed TSV anti-fuse structures having different programming conditions according to one embodiment.

Referring to FIG. 11, two deep trench anti-fuse structures 1100a, 1100b having different dielectric breakdown thresholds may be formed on different wafers using the processes described above in relation to FIGS. 1-7. Within a single substantially vertical trench 1120a, the deep trench anti-fuse 1100a may include a bottom electrical contact formed by TaN/Ta metallization liner 1102a, Cu/Mn liner 1104a, copper fill region 1115a, and TaN/Ta metallization liner 1106a. Within the single substantially vertical trench 1120a, the deep trench anti-fuse 1100a also includes a top electrical contact formed by TaN/Ta metallization liner 1110a, Cu/Mn liner 1118a, and copper fill region 1125a. Also, within the single substantially vertical trench 1120a, the top and the bottom electrical contacts are vertically and horizontally separated by dielectric layer 1108a. As an applied voltage across the electrical contacts exceeds the breakdown conditions of the dielectric layer 1108a, the electrical contacts are shorted together establishing a low resistance connection between the electrical contacts. The voltage at which the anti-fuse 1100a is activated (i.e., activated short circuit) may be the programming condition.

Still referring to FIG. 11, similarly, within another single substantially vertical trench 1120b, the deep trench capacitor 1100b may include a bottom electrical contact formed by TaN/Ta metallization liner 1102b, Cu/Mn liner 1104b, copper fill region 1115b, and TaN/Ta metallization liner 1106b. Within the single substantially vertical trench 1120b, the deep trench capacitor 1100b also includes a top electrical contact formed by TaN/Ta metallization liner 1110b, Cu/Mn liner 1118b, and copper fill region 1125b. Also, within the single substantially vertical trench 1120b, the top and the bottom electrical contacts are vertically and horizontally separated by dielectric layer 1108b. As an applied voltage across the electrical contacts exceeds the breakdown conditions of dielectric layer 1108b, the electrical contacts are shorted together establishing a low resistance connection between the electrical contacts. The voltage at which the anti-fuse 1100b is activated (i.e., activated short circuit) may be the programming condition.

Further referring to FIG. 11, anti-fuse structure 1100b may have a low programming condition compared to anti-fuse structure 1100a. Anti-fuse structure 1100a may have a high programming condition compared to anti-fuse structure 1100a. In particular, an electrical short between the contacts of anti-fuse structure 1100b is established at a lower voltage compared to anti-fuse structure 1100a. This is caused by anti-fuse structure 1100b having a relatively larger area dielectric layer 1108b which is more likely to fail based on an applied voltage (e.g., 25V). Conversely, anti-fuse structure 1100a having a relatively smaller area dielectric layer 1108a is less likely to fail based on the same applied voltage (e.g., 25V). In both anti-fuse structures 1100a and 1100b, the short may be created by a failure in the dielectric layer along either (e.g., or both) the horizontal portion $H'_p$ or the vertical portions $H'_v$ of respective dielectric layers 1108a and 1108b.

In the above described embodiments, the dielectric layers used for anti-fuse structures may be formed from, for example, oxides (e.g., $SiO_2$) using a higher temperature (e.g., 400C) atomic layer (ALD) deposition with nitridation. According to other examples, microwave oxide growth at low temperature (e.g., 200C) may also be accomplished. Also, aluminum oxide ($Al_2O_3$) may be used as a dielectric material. However, the breakdown voltage for $Al_2O_3$ is higher than $SiO_2$ and lower than both HfOx and HfSiOx. For example, the dielectric layer used for anti-fuse structures may include a dielectric material having a dielectric constant k-value of less than or about 4.0. The dielectric oxide materials that can be used in the deep trench capacitor structures may include, without limitation, HfOx, ZrO, $La_2O_3$, $Al_2O_3$, $TiO_2$, $SrTiO_3$, $LaAlO_3$, $Y_2O$, HfON, ZrON, $La_2ON$, $Al_2ON_3$, TiON, SrTiON, LaAlON, $Y_2ON$, HfSiOx, HfAlOx, HfSiOxN, HfAlOxN, HfTiLaON, HfTiAlON, HfSiO, HfSiOxN, ZrSiO, ZrSiOxN, and perovskites based high k dielectrics. For example, the dielectric layer for generating capacitor devices may include a high-k dielectric material having a dielectric constant k-value of more than about 7.0.

In some implementation, the choice of dielectric material k value may be selected such that the structures described above function as both a capacitor and fuse under different operating conditions. For example, for low voltage applications across the capacitor plates, the structure may function as a capacitor. However, for high voltage surges across the capacitor plates, the structure may function as an anti-fuse device based on a breakdown of the dielectric material in response to the high voltage.

The above exemplary embodiments describe processes for the creation of devices (e.g., deep trench capacitors and anti-fuses) within TSV based structures during the process of forming conventional TSV structures. It will be appreciated that the materials used to describe the various liners (i.e., Cu/Mn liners, TaN/Ta liners) and fill regions (i.e., copper fill regions) are exemplary and non-limiting. Thus, various other liner material and conductive fill regions may be contemplated using a myriad of know deposition (e.g., CVD, PECVD, SACVD, etc.) and etch (e.g., wet etching, dry RIE etching, etc.) processes.

Figure 12:
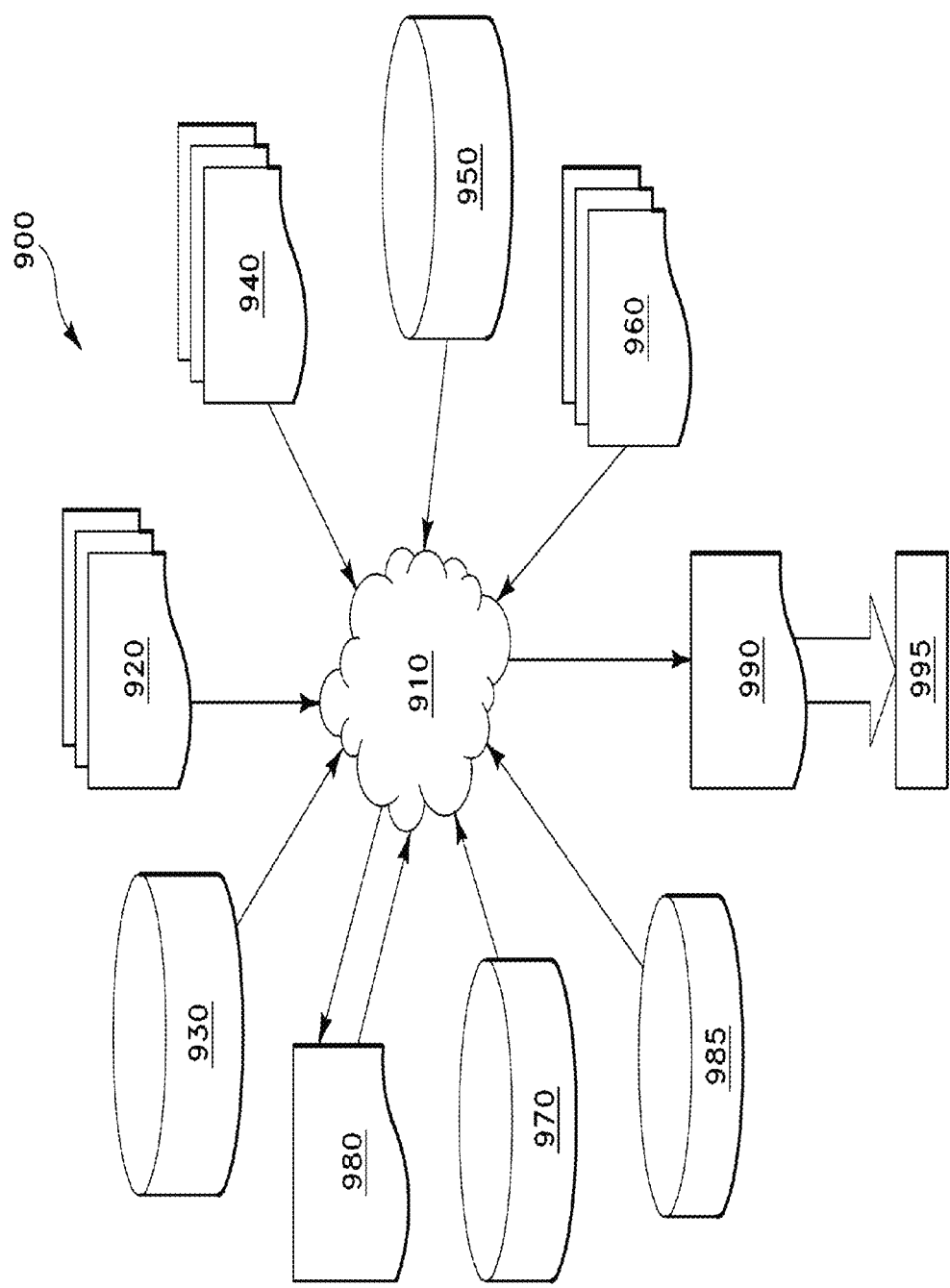
FIG. 12 is a flow diagram of a design process used in semiconductor design, manufacture, and/or test.

FIG. 12 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIGS. 7-11. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 7-11. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 7-11. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 7-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 7-11 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 7-11. In one embodiment, design structure 990 may comprise a compiled, executable HDL simulation model that functionally simulates the device structures shown in FIGS. 7-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 7-11. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A through-silicon-via (TSV) structure formed within a trench located within a semiconductor structure, the TSV structure comprising:
    a first electrically conductive liner layer located within the trench and extending along a vertical length of a side wall of the trench, the first electrically conductive liner layer including substantially u-shaped structure such that a bottom surface of the substantially u-shaped structure is co-planar with a bottom surface of the semiconductor structure and exposed through the bottom surface of the semiconductor structure;
    a first electrically conductive structure located on the first electrically conductive liner layer, the first electrically conductive structure partially filling the trench;
    a second electrically conductive liner layer located on the first electrically conductive structure;
    a dielectric layer located on the second electrically conductive liner layer;
    a third electrically conductive liner layer located on the dielectric layer; and
    a second electrically conductive structure located on the third electrically conductive liner layer and filling a remaining opening of the trench.

2. The TSV structure of claim 1, wherein the first electrically conductive structure comprises a copper seed layer and an electroplated copper region.

3. The TSV structure of claim 2, wherein the copper seed layer includes manganese (Mn).

4. The TSV structure of claim 1, wherein the first electrically conductive structure and the first electrically conductive liner layer and the second electrically conductive liner layer comprise a first capacitor electrode of a capacitor device.

5. The TSV structure of claim 4, wherein the second electrically conductive structure and the third electrically conductive liner layer comprise a second capacitor electrode of the capacitor device.

6. The TSV structure of claim 5, wherein the capacitor device comprises:
    a first capacitance created between the first capacitor electrode and the second capacitor electrode and a first portion of the dielectric layer located substantially vertically along the side wall of the trench; and
    a second capacitance created between the first capacitor electrode and the second capacitor electrode and a second portion of the dielectric layer located substantially horizontally between the side wall of the trench.

7. The TSV structure of claim 5, wherein the dielectric layer comprises a high-k film.

8. The TSV structure of claim 7, wherein the high-k film comprises a thickness of about 100 Å to about 1000 Å.

9. The TSV structure of claim 5, wherein the first capacitor electrode and the second capacitor electrode are each of substantially circular shape.

10. The TSV structure of claim 1, wherein the trench comprises a depth of about 5 µm to about 100 µm relative to a top opening of the trench, and wherein the trench comprises a diameter of about 2-20 µm.

11. The TSV structure of claim 1, wherein the first, the second, and the third electrically conductive liner layer each comprise a tantalum nitride (TaN) layer and tantalum (Ta) layer.

12. The TSV structure of claim 1, wherein the first electrically conductive structure comprises a first volume of electrically conductive material within the trench, and the second electrically conductive structure comprises a second volume of electrically conductive material within the trench, the ratio of the first volume of electrically conductive material with respect to the second volume of electrically conductive material determining a capacitance value between the first electrically conductive structure and the second electrically conductive structure.

13. The TSV structure of claim 12, wherein the first volume of electrically conductive material and the second volume of electrically conductive material comprise a copper (Cu) material having manganese (Mn).

14. The TSV structure of claim 1, wherein the second electrically conductive structure comprises a copper seed layer having manganese and an electroplated copper region.

15. The TSV structure of claim 1, wherein the trench is of substantially circular shape.

* * * * *